(12) United States Patent
Wang et al.

(10) Patent No.: US 9,111,600 B2
(45) Date of Patent: Aug. 18, 2015

(54) MEMORY CELL WITH IMPROVED WRITE MARGIN

(75) Inventors: Yih Wang, Portland, OR (US); Muhammad M. Khellah, Tigard, OR (US); Fatih Hamzaoglu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 137 days.

(21) Appl. No.: 13/997,633

(22) PCT Filed: Mar. 30, 2012

(86) PCT No.: PCT/US2012/031455
§ 371 (c)(1),
(2), (4) Date: Jun. 24, 2013

(87) PCT Pub. No.: WO2013/147848
PCT Pub. Date: Oct. 3, 2013

(65) Prior Publication Data
US 2014/0003181 A1    Jan. 2, 2014

(51) Int. Cl.
*G11C 7/00* (2006.01)
*G11C 5/14* (2006.01)
*G11C 11/413* (2006.01)

(52) U.S. Cl.
CPC *G11C 5/14* (2013.01); *G11C 5/147* (2013.01); *G11C 11/413* (2013.01); *G11C 5/148* (2013.01)

(58) Field of Classification Search
CPC ...... G11C 5/14; G11C 5/147; G11C 11/4074; G11C 16/30; G11C 2029/0407; G11C 29/50016; G11C 11/4072; G11C 5/063; G11C 5/148
USPC ............................. 365/226, 227, 154, 189.09
See application file for complete search history.

(56) References Cited

U.S. PATENT DOCUMENTS

| 6,011,713 | A | 1/2000 | Yamane et al. |
| 6,785,179 | B1 | 8/2004 | Bull et al. |

(Continued)

FOREIGN PATENT DOCUMENTS

| KR | 10-2005-0037138 | 4/2005 |
| WO | 2013/147848 A1 | 10/2013 |

OTHER PUBLICATIONS

International Preliminary Report on Patentability mailed Oct. 9, 2014, for International Patent Application No. PCT/US2012/031455.
International Search Report and Written Opinion issued for International Patent Application No. PCT/US2012/031455, mailed Nov. 30, 2012, 9 pages.

*Primary Examiner* — David Lam
(74) *Attorney, Agent, or Firm* — Green, Howard & Mughal, LLP

(57) ABSTRACT

Described is an apparatus and system for improving write margin in memory cells. In one embodiment, the apparatus comprises: a first circuit to provide a pulse signal with a width; and a second circuit to receive the pulse signal and to generate a power supply for the memory cell, wherein the second circuit to reduce a level of the power supply below a data retention voltage level of the memory cell for a time period corresponding to the width of the pulse signal. In one embodiment, the apparatus comprises a column of memory cells having a high supply node and a low supply node; and a charge sharing circuit positioned in the column of memory cells, the charge sharing circuit coupled to the high and low supply nodes, the charge sharing circuit operable to reduce direct-current (DC) power consumption.

15 Claims, 15 Drawing Sheets

(56) References Cited

U.S. PATENT DOCUMENTS

| | | |
|---|---|---|
| 7,400,545 B2 * | 7/2008 | Ramaraju et al. ............. 365/227 |
| 7,426,152 B2 * | 9/2008 | Yamashita et al. ............ 365/226 |
| 7,606,092 B2 * | 10/2009 | Eby et al. ...................... 365/201 |
| 7,697,320 B2 * | 4/2010 | Masuo et al. ................. 365/154 |
| 2005/0083291 A1 | 4/2005 | Chung et al. |
| 2009/0027947 A1 | 1/2009 | Takeda |
| 2009/0316500 A1 | 12/2009 | Mikan et al. |

* cited by examiner

MEMORY CELL WITH IMPROVED WRITE MARGIN

CLAIM OF PRIORITY

This application claims the benefit of priority of International Patent Application No. PCT/US2012/031455 filed Mar. 30, 2012, titled "MEMORY CELL WITH IMPROVED WRITE MARGIN," which is incorporated by reference in its entirety.

BACKGROUND

Reducing memory cell power supply voltage level for a column of memory selected for write operation (or during write operation) improves write margin. However, reducing the power supply voltage level may result in the data loss.

BRIEF DESCRIPTION OF THE DRAWINGS

Embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 2:
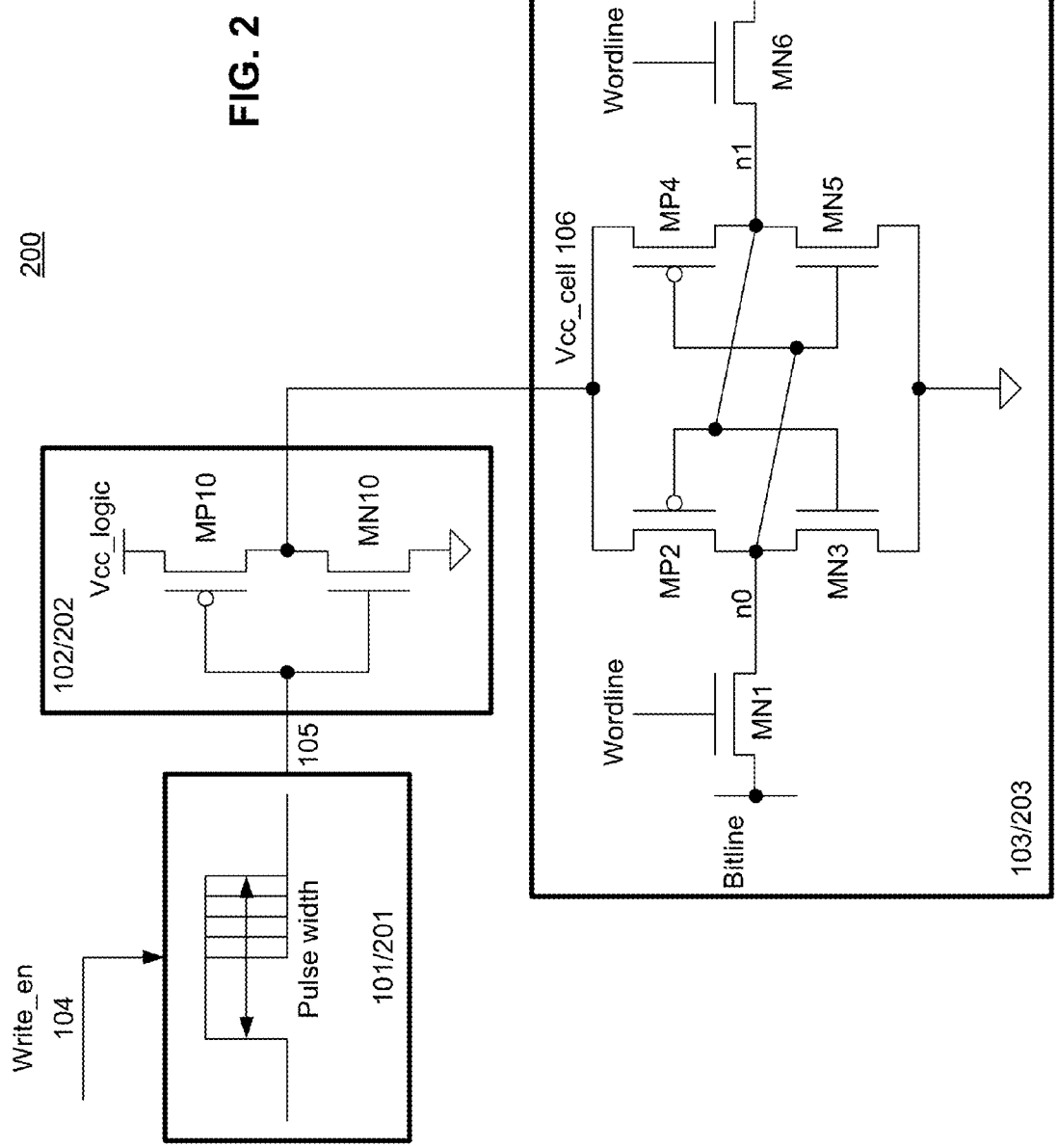
FIG. 2 is circuit implementation of the high level block diagram, according to one embodiment of the disclosure.

In a typical six transistor (6T) Static Random Access Memory (SRAM), increasing p-type transistor (e.g., PMOS) current may result in reduced write margin of SRAM cells due to the worsened contention between passgate n-type transistor (e.g., NMOS transistor MN6 of FIG. 2) and pullup p-type transistor (e.g., PMOS transistor of MP4 of FIG. 2). The reduced write margin limits scaling (i.e., reduction) of the SRAM minimum operating voltage (Vcc_min) for low-voltage operation. Reducing the SRAM cell supply voltage (Vcc_cell) during write operations may reduce contention between the pullup PMOS (e.g., MP4 of FIG. 2) transistor and passgate NMOS (e.g., MN6 of FIG. 2) transistor. However, such voltage droop techniques are constrained by the data retention voltage (DRV) of the SRAM cell, where the Vcc_cell needs to stay above DRV to avoid data retention failure.

The term "write margin" herein generally refers to the minimum voltage margin of a memory cell below which the memory cell does not conduct write operation reliably.

The term "data retention voltage" herein generally refers to the voltage level for a memory cell below which the memory cell loses its stored value.

Described herein is an apparatus and system for improving memory cell (e.g., 6T SRAM) write margin by dynamically reducing the power supply level of the memory cell for a programmable or fixed (i.e., predetermined) time duration during write operation. In one embodiment, the voltage level for the power supply is dropped to zero without losing data in other non-selected cells i.e., memory cells not selected for write operation. The embodiments discussed herein allow memory cells to operate at much lower power supply voltage levels than conventional memory cells because the write margin for the memory cells is improved i.e., the write margin increases.

The embodiments discussed herein allow the memory cell (e.g., 6T SRAM) to sustain a transient Vcc_cell droop below DRV without incurring data retention failure. For example, Vcc_cell may be dropped more than 300 mV below DRV. In such embodiments, the duration of transient voltage droop Td may be maintained below a threshold time (Td_max). This dynamic behavior of data retention allows the memory cell to operate with a far deeper Vcc_cell droop than traditional Vcc_cell droops to eliminate or reduce contention between the passgate transistor (MN6 of FIG. 2) and the pullup transistor (MP4 of FIG. 2) with little or no impact to data retention and read stability. Other technical effects not listed are contemplated by the embodiments discussed herein.

The term "scaling" with reference to process refers generally to transferring the circuit design and layout from one process technology to another process technology.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The term "substantially" herein refers to being within 10% of the target.

For purposes of the embodiments described herein, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The terms "MN" herein indicates an n-type transistor (e.g., NMOS, NPN BJT, etc) and the term "MP" indicates a p-type transistor (e.g., PMOS, PNP BJT, etc).

Figure 1:
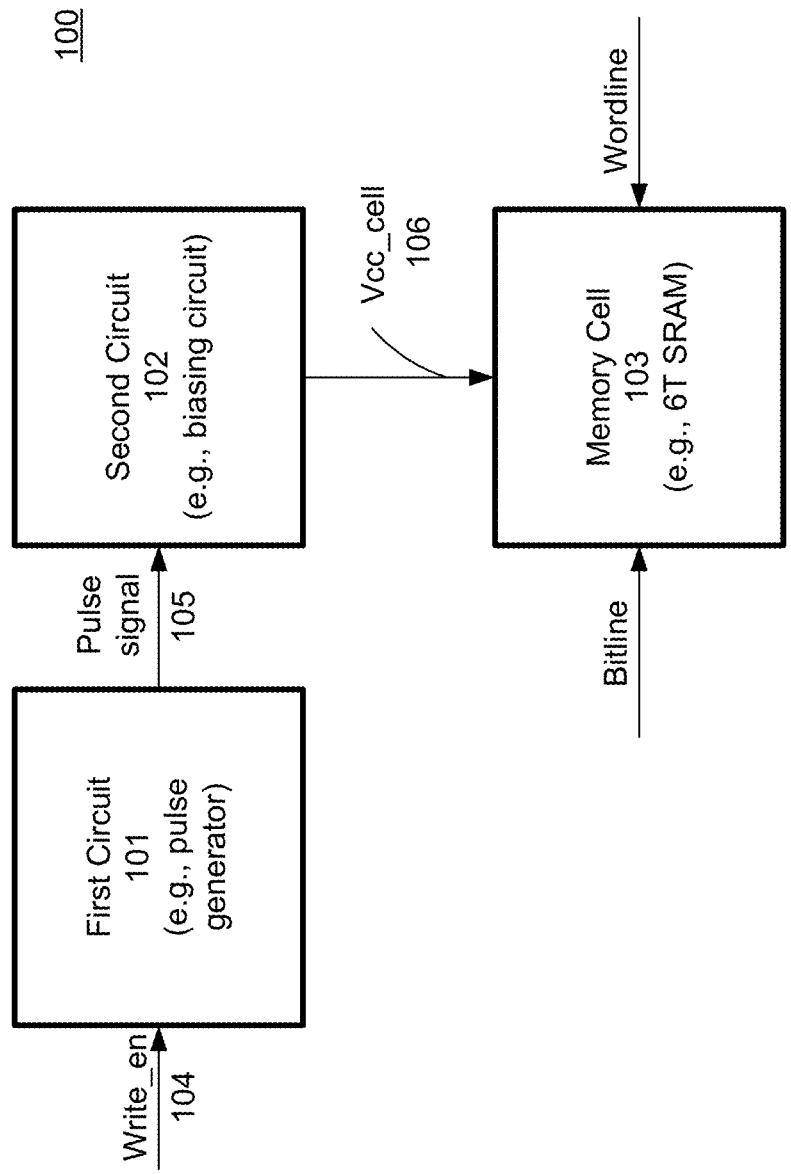
FIG. 1 is a high level block diagram to dynamically adjust power supply to a memory cell, according to one embodiment of the disclosure.

FIG. 1 is a high level block diagram of an apparatus 100 to dynamically adjust power supply Vcc_cell to a memory cell, according to one embodiment of the disclosure. In one embodiment, the apparatus 100 comprises a first circuit 101, a second circuit 102, and a memory cell 103.

In one embodiment, the first circuit 101 is a pulse generator to generate a pulse signal 105 with a pulse width. Any known pulse generator may be used as the first circuit 101. In one embodiment, the pulse generator is operable to generate a pulse signal 105 when the memory cell 103 is enabled to be written i.e., signal write_en 104 indicates that the memory cell 103 is operable to be written.

In one embodiment, the pulse generator is operable to provide the pulse signal 105 with variable or adjustable pulse width. In one embodiment, the duration of the pulse width determines the time Vcc_cell 106 is allowed to droop below the DRV level for the memory cell 103. In one embodiment, the pulse generator comprises an adjustable delay element (e.g., delay line) to provide a pulse signal 105 of varying width. In one embodiment, the pulse width is predetermined based on memory transistor leakage studies for a given process technology. In one embodiment, the pulse width is set at manufacturing time using fuses. In other embodiments, the pulse width can be set or adjusted by software. For example, the pulse width may be adjusted by an operating system.

In one embodiment, the second circuit 102 receives the pulse signal 105 from the pulse generator of the first circuit 101 and generates the power supply Vcc_cell 106 for the memory cell 103. In one embodiment, the second circuit 102 is a biasing circuit. In one embodiment, the second circuit 102 is an inverter.

In one embodiment, the second circuit 102 is operable to reduce the power supply Vcc_cell 106 below DRV level for the duration of the pulse width of the pulse signal 105. In one embodiment, the second circuit 102 is operable to reduce the power supply Vcc_cell 106 to ground, for the duration of the pulse width of the pulse signal 105. In one embodiment, the second circuit 102 is operable to reduce the power supply Vcc_cell 106 to be below the DRV level and above ground, for the duration of the pulse width of the pulse signal 105. In one embodiment, the second circuit 102 is operable to reduce the power supply Vcc_cell 106 to be a p-type transistor threshold below DRV, for the duration of the pulse width of the pulse signal 105.

In the embodiments discussed herein, the first and second circuits may operate at a power supply different from the power supply 106 of the memory cell 103. For example, the first and second circuits, 101 and 102 respectively, may operate at a power supply higher than the power supply 106 of the memory cell. In one embodiment, the first and second circuits, 101 and 102 respectively, may operate at a power supply of the same level as the power supply 106 of the memory cell 103. While the embodiments herein show the first and second circuits 101 and 102 as two separate circuits, they may be combined together in one embodiment.

In one embodiment, the memory cell 103 is an SRAM cell. In one embodiment, the SRAM cell is a 6T SRAM cell. Any known 6T SRAM cell may be used. In other embodiments, other memory cells with fewer or more transistors may be used. For example, the memory cell is a 4T SRAM cell, or an 8T SRAM cell. The memory cell 103 is operable to receive bitline and wordline signals with conventional applications which are not discussed herein so as not to obscure the embodiments of the disclosure.

FIG. 2 is circuit implementation 200 of the high level block diagram 100, according to one embodiment of the disclosure. In one embodiment, the first circuit 101/201 is a pulse generator to generate the pulse signal 105. The horizontal arrow on the pulse width of the pulse signal 105 indicates an adjustable pulse width. In one embodiment, the pulse width is adjustable by an adjustable delay line (not shown) which is operable to receive a signal via a fuse or software or both.

In one embodiment, the second circuit 102/202 is an inverter including a p-type transistor MP10 and an n-type transistor MN10 coupled together as shown. In one embodiment, the source terminal of the p-type transistor MP10 is coupled to the power supply Vcc_logic different from the power supply Vcc_cell for the memory cell 103/203.

The term "different" generally refers to having different power supply nodes i.e., a power supply on a node can be adjusted independent of the other power supply on the other node. The term "different" also encompasses the same or different power supply levels.

In one embodiment, the gate terminals of MP10 and MN10 receive the pulse signal 105. In one embodiment, during the pulse width of the pulse signal 105, MN10 is turned on which reduces the power supply Vcc_cell 106. In one embodiment, the power supply Vcc_cell 106 is reduced to zero by the second circuit 102/202. In one embodiment, when the pulse of the pulse signal ends (e.g., the pulse signal returns to a logical zero level from a logical high level or when the pulse returns from a logical high level to a logical low level), MP10 turns to provide Vcc_cell 106 with power supply corresponding to Vcc_logic.

The second circuit 102/202 is also referred to as a biasing circuit which generates transient Vcc_cell 106 droop with varying durations through programmable pulses. In one embodiment, Vcc_cell 106 is first collapsed to substantially zero volts through transistor MN10 to assist write operation in the memory cell 103/203. In such an embodiment, Vcc_cell 106 is then restored to Vcc_logic level with transistor MP10 after the memory cell 103/203 flips the stored state. The programmable pulses from the first circuit 101/201 allow characterization of DRV and write Vcc_min for a wide range of Td and transient Vcc_cell 106 droop.

In one embodiment, the memory cell 103/203 is a 6T SRAM cell with a power supply node Vcc_cell 106 coupled to the output of the second circuit 102/202. In one embodiment, the six transistors of the 6T SRAM cell comprise two passgates MN1 and MN6 with gate terminals coupled to the wordline signal. In one embodiment, the source/drain terminal of the n-type transistor MN1 is coupled to bitline while the drain/source terminal n0 of the n-type transistor MN1 is coupled to the gate terminals of the transistors MN5 and MP4 and the source/drain terminals of MP2 and MN3. In one embodiment, the source/drain terminal of the n-type transistor MN6 is coupled to bitline# (inverse of bitline) while the drain/source terminal n1 of the n-type transistor MN6 is coupled to the gate terminals of the transistors MN3 and MP2 and the source/drain terminals of MP4 and MN5. In one embodiment, the source terminals of MN3 and MN5 are coupled to ground terminal.

Figure 3:
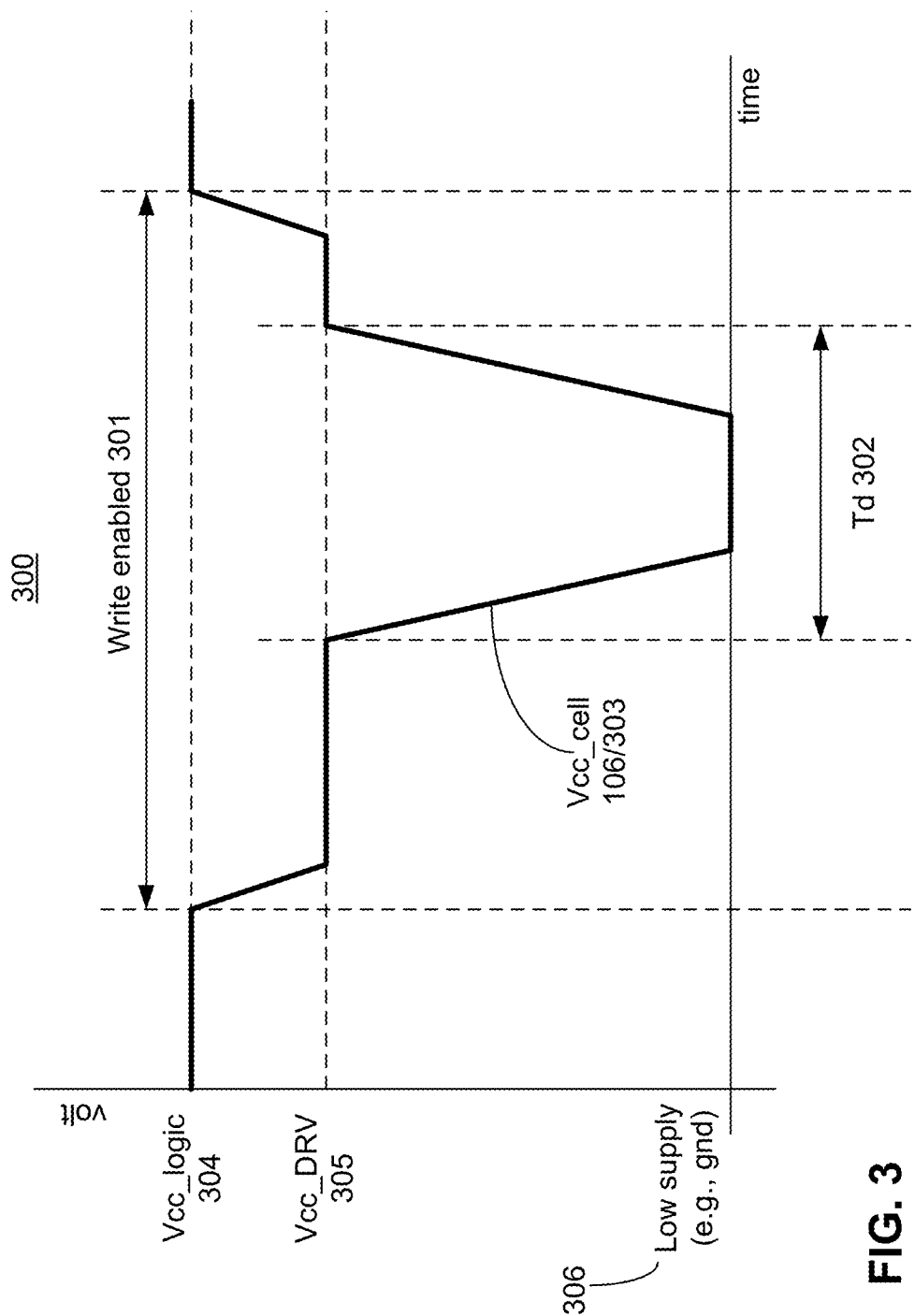
FIG. 3 is a plot illustrating the operation of the circuit implementation in which the power supply is dynamically collapsed during write operation, according to one embodiment of the disclosure.

FIG. 3 is plot 300 illustrating the operation of the circuit implementation in which the power supply Vcc_cell 303 for a column of memory cells is dynamically collapsed during write operation, according to one embodiment of the disclosure. The term "dynamically collapsed" herein generally refers to transient reduction of a voltage level below DRV.

The x-axis refers to a time scale while the y-axis refers to a voltage scale. The waveform Vcc_cell 106/303 is set to Vcc_logic level 304 by the second circuit 102/202 during read operation or idle state. In one embodiment, when the write enabled 301 indicates a write operation for the memory cell column, the Vcc_cell 106/303 is dropped to Vcc_DRV level 305.

In one embodiment, during the pulse width Td 302 of the pulse signal 105, the second circuit 101/202 collapses the voltage level Vcc_cell 106/303 to a low supply level 306. In one embodiment, the low supply level 306 is ground. In one embodiment, the second circuit 102/202 is operable to collapse the Vcc_cell 106/303 level to the lower supply node (which is below the Vcc_DRV 305 level) without dropping the Vcc_cell 106/303 to an intermediate level of Vcc_DRV 305, where Vcc_DRV 305 is below Vcc_logic 304 but above the low supply level 306.

Figure 4A:
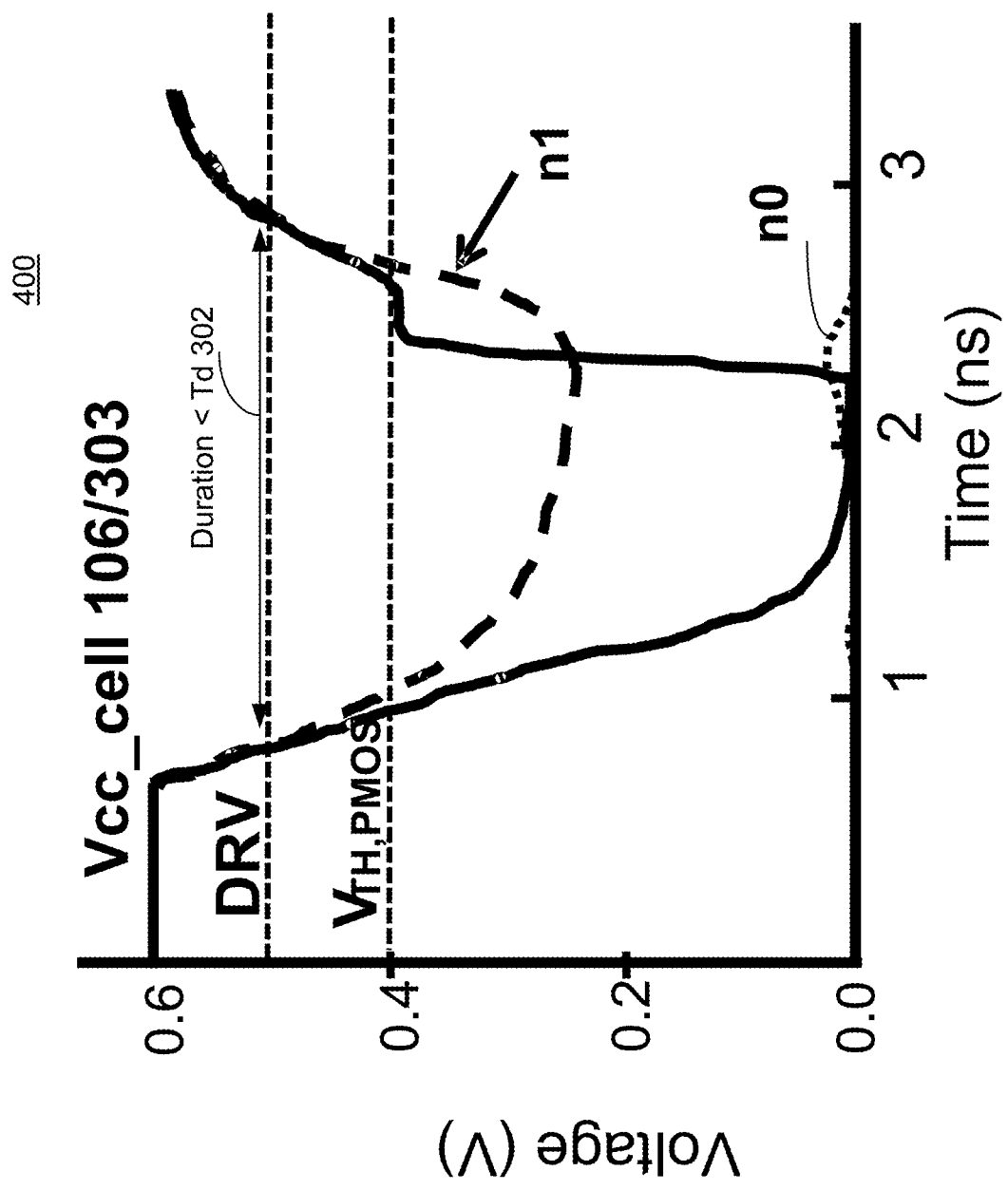
FIG. 4A is a plot illustrating the transient behavior of nodes of the unselected memory cell, according to one embodiment of the disclosure.

FIG. 4A is a plot 400 illustrating the transient behavior of nodes n0 and n1 of the unselected memory cell 102, according to one embodiment of the disclosure. FIG. 4A is described with reference to FIGS. 1-3. The term "unselected" herein refers generally to a column of memory cells not enabled for writing i.e., the wordline of the unselected memory cell is biased at ground and its pass gate is turned off. In this embodiment, the unselected memory cell (e.g., 6T SRAM cell 103/203) retains data after power supply Vcc_cell 106/303 collapses below DRV level for a timing duration 302. In one embodiment, the Vcc_cell 106/303 may not be collapsed for the unselected memory cells.

Vcc_cell 106/303, shown as solid line in FIG. 4A, is collapsed for an unselected bit cell, according to one embodiment. In one embodiment, when Vcc_cell 106/303 is collapsed below DRV level for duration less than Td 302, the unselected memory cell retains data.

Figure 4B:
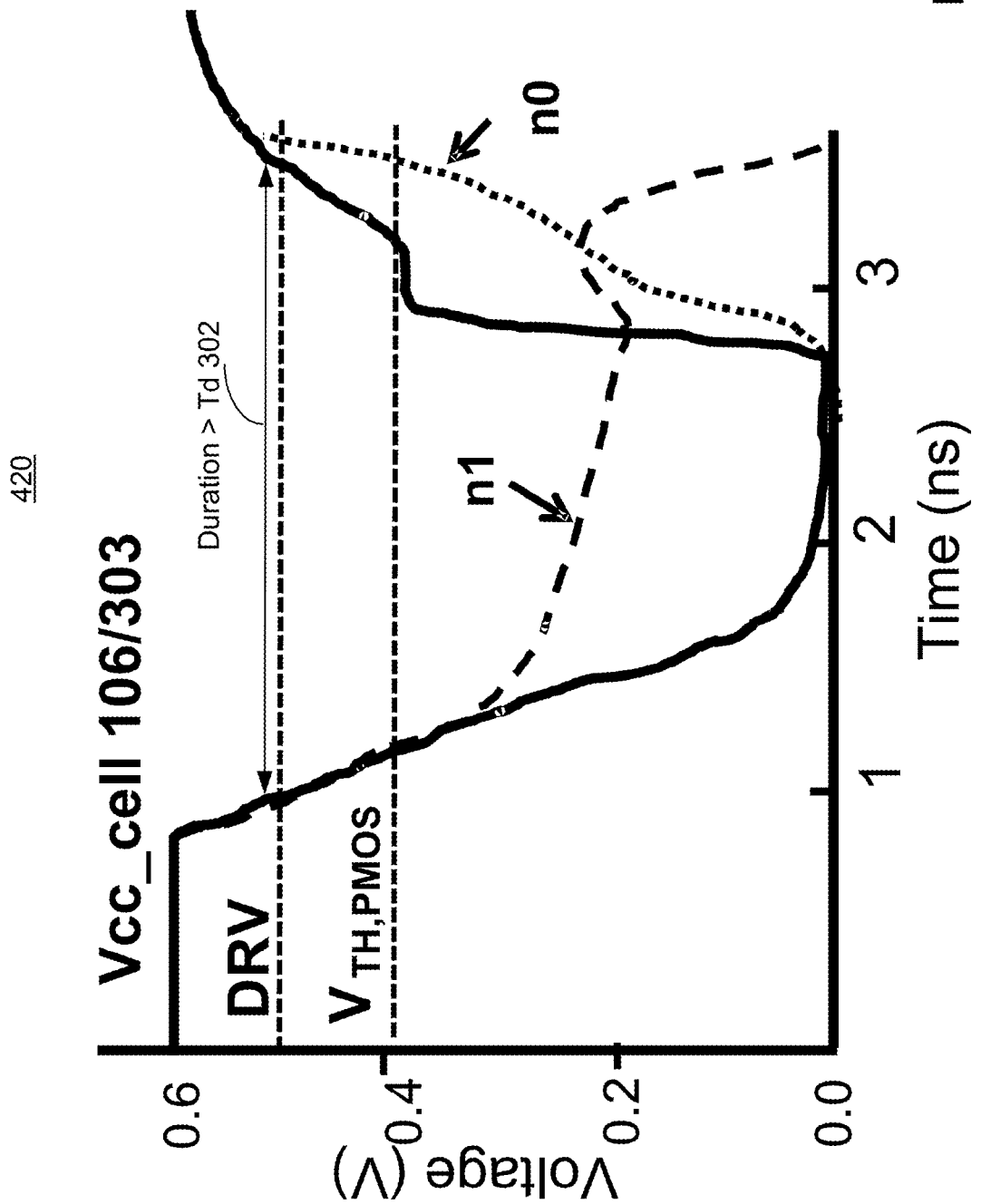
FIG. 4B is a plot illustrating the transient behavior of nodes of the unselected memory cell, according to one embodiment of the disclosure.

FIG. 4B is a plot 420 illustrating the transient behavior of nodes n0 and n1 of the unselected memory cell 102, according to one embodiment of the disclosure. FIG. 4B is described with reference to FIGS. 1-3. In this embodiment, the unselected memory cell (e.g., 6T SRAM cell 103/203) lose data after the supply voltage Vcc_cell 106/303 collapses for duration greater than Td 302, also referred to as the dynamic data retention time.

In this example, Vcc_cell 106/303 is collapsed below DRV for 2.4 ns in FIG. 4A, and 5.2 ns in FIG. 4B, respectively. As Vcc_cell is lowered substantially near 0V, transistor MP4 is switched off and voltage of storage node n1 (V_n1) is discharged to a quiescent level near $V_{TH}$ (threshold voltage) of MP4 caused by leakages of transistors MP4, MN5 and MN6. The settling time of V_n1 is estimated to be on the order of tens of nanosecond for a 32 nm low-power (LP) SRAM after factoring in the various transistor leakage sources and charges stored at node n1. For the memory cell 103/203 to flip state, V_n1 needs to droop below the trip point of the left inverter comprising transistors MP2 and MN3. As long as the Vcc_cell is restored above DRV before V_n1 falls below the inverter trip point, data retention failure can be avoided. In this example, during a worse-case leakage corner and at 95° C., the memory cell 103/203 still retains data even with Vcc_cell 106/303 lowered to 0.1V for Td of 2.4 ns. As Td is increased to 5.2 ns in FIG. 4B, V_n1 falls below the trip point of the inverter, causing the memory cell to flip state when Vcc_cell is restored to Vcc_logic by the second circuit 102/202.

Figure 4C:
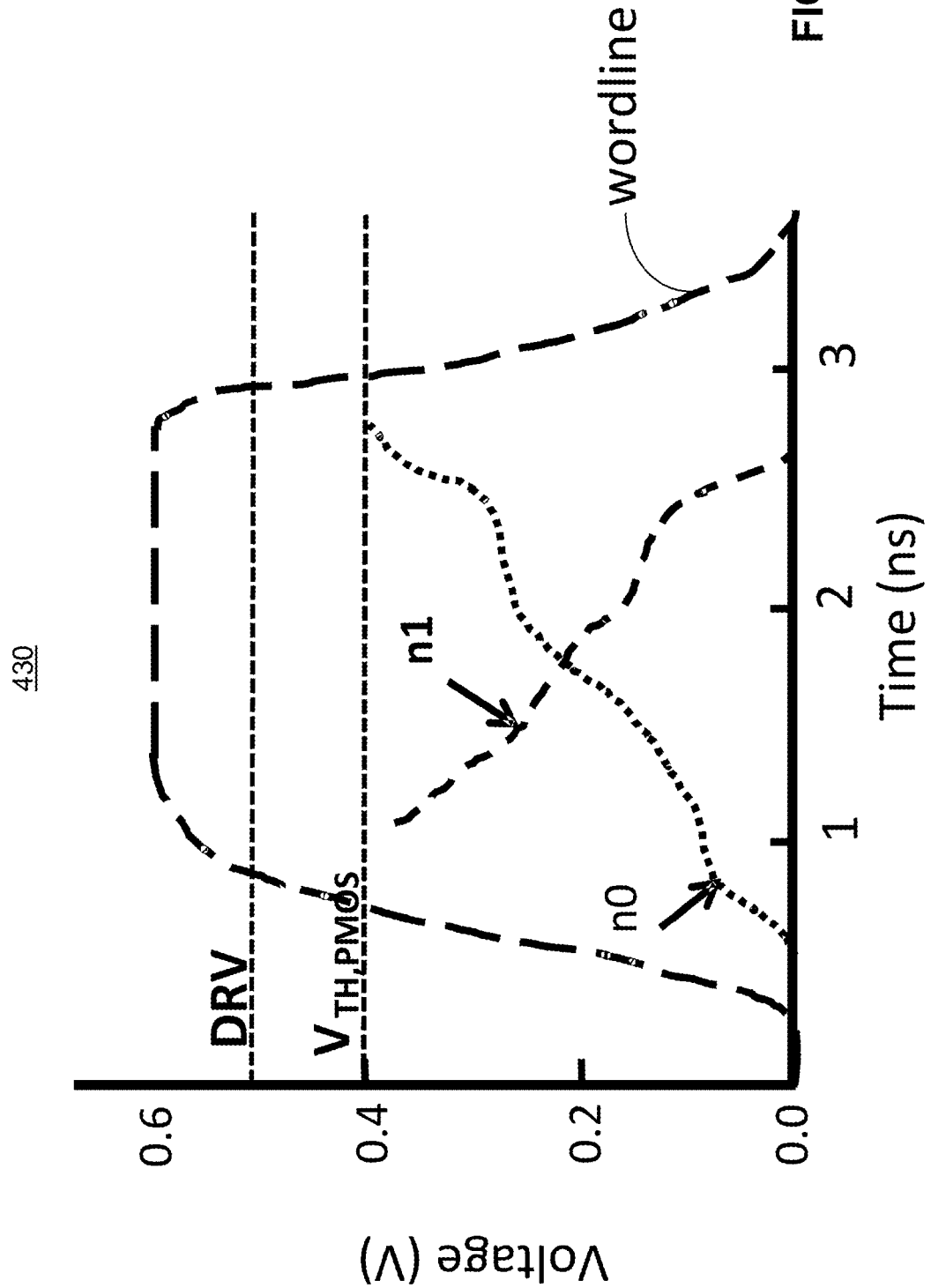
FIG. 4C is a plot illustrating the transient behavior of nodes of the selected memory cell 102, according to one embodiment of the disclosure.

FIG. 4C is a plot 430 illustrating the transient behavior of nodes n0 and n1 of the selected memory cell 102, according to one embodiment of the disclosure. FIG. 4C is described with reference to FIGS. 1-3. The term "selected cell" herein refers to the memory cell identified for write operation. In this embodiment, the cell operation (via waveforms of Vcc_cell V_n0, V_n1 and wordline) is illustrated during write operation.

In this example, Vcc_cell 106/303 is collapsed to the same level as shown in FIG. 4A-B for Td of 2.4 ns. Td of 2.4 ns is shown in this example to be sufficient to complete write operation at a supply voltage of 0.6V. With the Td in the range of nanosecond, it provides sufficient timing margin for the circuit 200 to be effective in reducing write voltage while mitigating the impact of data retention failure of unselected cells in the same column.

Figure 5:
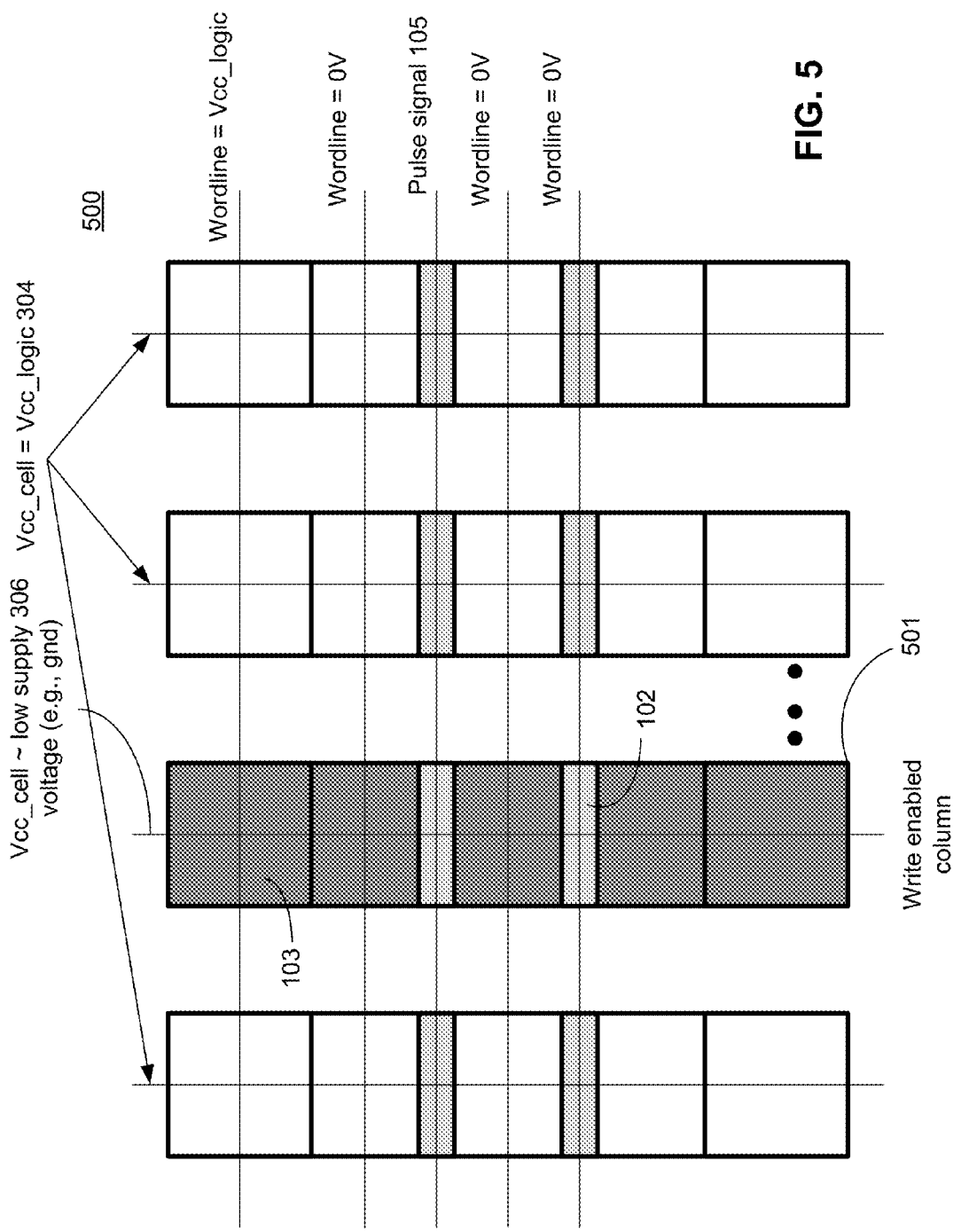
FIG. 5 illustrates columns of memory cells in an array with the circuit for dynamically collapsing power supply voltage during write operation, according to another embodiment of the disclosure.

FIG. 5 illustrates columns of memory cells in an array 500 with the circuit 102 for dynamically collapsing power supply voltage during write operation, according to another embodiment of the disclosure. In one embodiment, the supply voltage Vcc_cell of SRAM cells in written columns is lowered below DRV to improve write margin. So as not to obscure the embodiments of the invention, the selected column 501 (shaded) is discussed.

Unselected cells in column 501 face increased susceptibility to retention failures caused by voltage droop. In one embodiment, the supply voltages of unselected columns 304 are not collapsed below DRV, and so there is little or no risk of retention failures for unselected cells in other unselected columns. As discussed herein, conventional bias techniques limit Vcc_cell droop between the logic supply voltage (Vcc_logic) and DRV to avoid data retention failure. With such limited Vcc_cell droop, transistor MP4 still operates near the saturation regime, limiting write margin improvement. In the embodiments discussed herein, Vcc_cell is lowered below the threshold voltage of MP4 which can increase write margin as MP4 is switched off and write margin becomes insensitive to the variation of the threshold voltage of MP4. In one embodiment, Vcc_cell is briefly collapsed substantially near 0V or at 0V to switch off MP4 while circumventing data retention failure by controlling the duration of the voltage collapse.

The following examples pertain to further embodiments. Specifics in the examples may be used anywhere in one or more embodiments. All optional features of the apparatus described herein may also be implemented with respect to a method or process.

For example, in one embodiment the apparatus for improving write margin of a memory cell comprises: a first circuit to provide a pulse signal with a width; and a second circuit to receive the pulse signal and to generate a power supply for the memory cell, wherein the second circuit to reduce a level of the power supply below a data retention voltage level of the memory cell for a time period corresponding to the width of the pulse signal. In one embodiment, the second circuit comprises an inverter which is operable to receive the pulse signal as an input, wherein the inverter has an output to provide the power supply for the memory cell.

In one embodiment, the second circuit is operable to reduce the level of the power supply to the memory cell during write operation of the memory cell. In one embodiment, the second circuit is operable to provide the power supply to the memory cell during read operation of the memory cell. In one embodiment, the first circuit is operable to adjust the width of the pulse signal. In one embodiment, the first circuit is operable to adjust the width of the pulse signal by at least one of: a fuse; or software instruction. In one embodiment, the first circuit comprises a pulse generator with a variable delay to provide an adjustable pulse width. In one embodiment, the memory cell is a 6T SRAM cell. In one embodiment, the second circuit is operable to reduce the power supply level to be between ground and the data retention voltage. In one embodiment, the second circuit is operable to reduce the power supply level to ground. In one embodiment, the second circuit is operable to provide normal power supply to the memory cell after the pulse width ends.

In another example, a system comprises: a wireless antenna; and a processor capable of communicating with another device via the wireless antenna, the processor including an array of memory cells and comprising the apparatus discussed herein.

Described herein is also an apparatus for reducing direct-current (DC) power consumption in a memory cell apparatus during write operation. Reducing memory cell supply voltage in the written column of memory cells may increase memory cell write margin. However, reducing memory cell supply voltage Vcc_cell 606 using traditional ratioed circuits consume static current. High static current incurred in each write operation is not suitable for low-power applications.

Described herein is a charge sharing circuit based on the principle of charge sharing to generate dynamic supply voltage droop for memory cell write operation. In one embodiment, the charge sharing circuit applies charge sharing of the Vcc_cell 606 (high supply) and Vss_cell 608 (ground or low supply) nodes of a memory array to generate memory power supply voltage droop. In one embodiment, traditional ratioed bias circuits are eliminated resulting in removing static current consumption for low-power applications. In one embodiment, the charge sharing circuit has a footprint which is substantially similar to the footprint of the memory cell and so the charge sharing circuit can be integrated into the memory array with minimum area overhead and minimum interruption of memory array layout to maintain high manufacturing yield.

The term "footprint" herein generally refers to the aspect ratio (width and length) of the layout of the circuit. Having a substantially similar footprint generally means that the position of contacts, transistor terminals, transistor position, and sizes (W/L), etc are within 10% of the target cell, for example, the memory cell.

Figure 6:
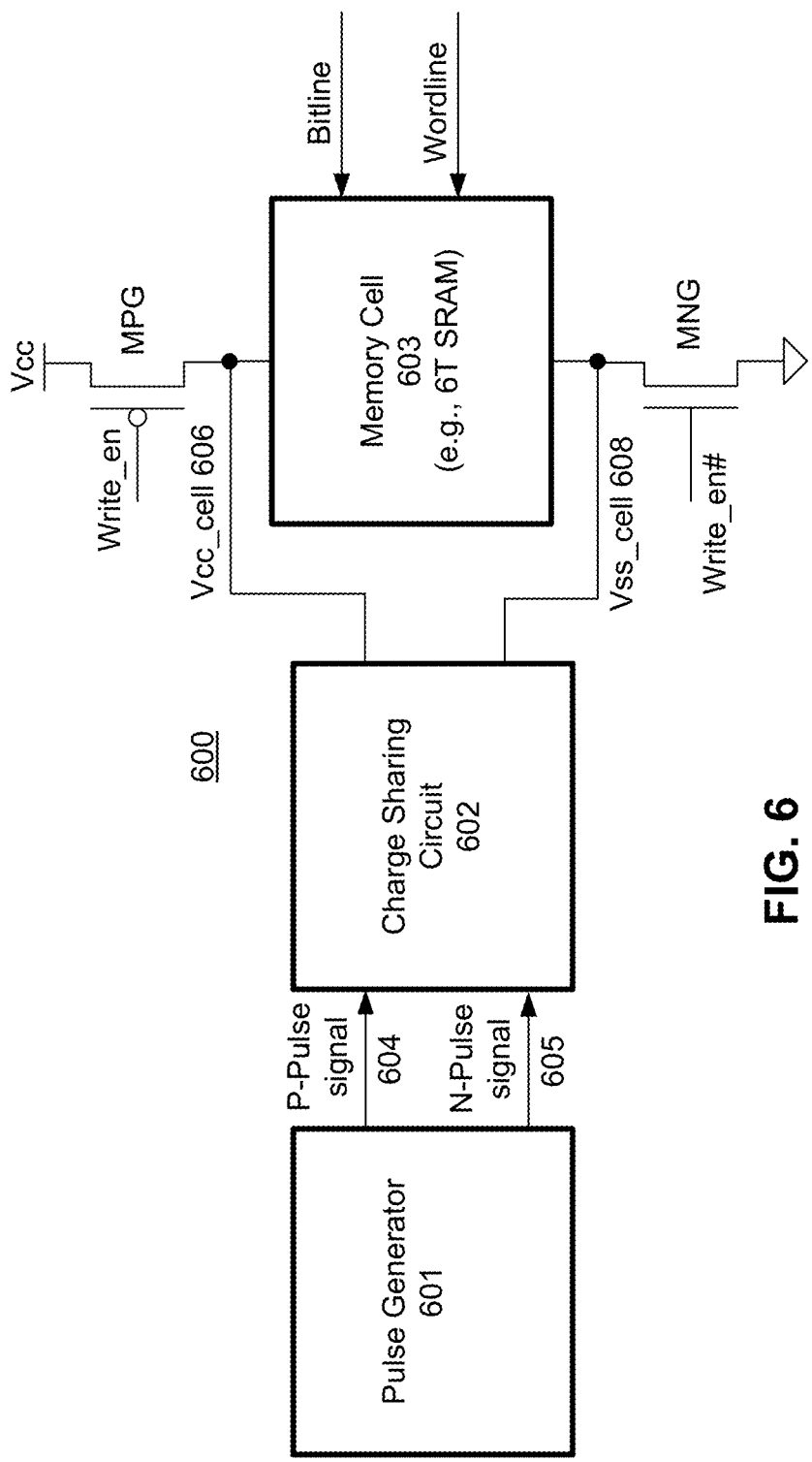
FIG. 6 is a block diagram with a charge sharing circuit for adjusting voltage levels at the supply nodes of the memory cell, according to one embodiment of the disclosure.

FIG. 6 is a block diagram of an apparatus 600 with a charge sharing circuit for adjusting voltage levels at the supply nodes of the memory cell, according to one embodiment of the disclosure. In one embodiment, the apparatus comprises a pulse generator 601, a charge sharing circuit 602, a memory cell 603, and power supply gates MPG and MNG.

In one embodiment, the pulse generator 601 generates a P-pulse signal 604 and/or an N-pulse signal 605 which is received by the charge sharing circuit 602. In one embodiment, the charge sharing circuit 602 enables charge sharing of the power supply on the nodes Vcc_cell 606 and Vss_cell 608 during write operation to cause a droop on the high power supply node, Vcc_cell 606, and rise on the low power supply node, Vss_cell 608. In one embodiment, during read operation or idle state, Vcc_cell 606 and Vss_cell 608 are connected to VCC and ground through the power gate transistors MPG and MNG, respectively.

In one embodiment, during write operation the power gate transistors MPG and MNG are turned off by the write_en and write_en# (inverse of write_en) signals respectively. In such an embodiment, Vcc_cell 606 and Vss_cell 608 nodes are floated with the initial voltages of VCC and VSS, respectively. In one embodiment, to generate the supply voltage droop on Vcc_cell 606, the charge sharing between Vcc_cell 606 and Vcc_cell 608 nodes is turned on. In one embodiment, by turning on transistors in the charge sharing circuit 602 allows charge initially stored on the Vcc_cell 606 node to pass onto the Vss_cell 608 node, creating a voltage droop on the Vcc_cell 606 node and a voltage bump on Vss_cell 608 node.

By creating voltage droop on the Vcc_cell 606 node, charge sharing consumes little or no static current. In one embodiment, the voltage generated on Vcc_cell 606 node is controlled by the capacitance ratio of the capacitance on Vcc_cell 606 node and capacitance on Vss_cell 608 node. In one embodiment, the voltage generated on Vcc_cell 606 node is controlled by threshold voltages of transistors in the charge sharing circuit 602 and the pulse widths of P-pulse signal 604 and/or the N-pulse signal 605. In one embodiment, the duration of the voltage generated on Vcc_cell 606 node by the charge sharing circuit 602 is controlled by the pulse widths of P-pulse signal 604 and/or the N-pulse signal 605.

In one embodiment, the memory cell 603 is an SRAM cell. In one embodiment, the SRAM cell is a 6T SRAM cell. Any known 6T SRAM cell may be used. In other embodiments, other memory cells with fewer or more transistors may be used. For example, the memory cell is a 4T SRAM cell, or an 8T SRAM cell. The memory cell 603 is operable to receive bitline and wordline signals with conventional applications which are not discussed herein so as not to obscure the embodiments of the disclosure.

Figure 7:
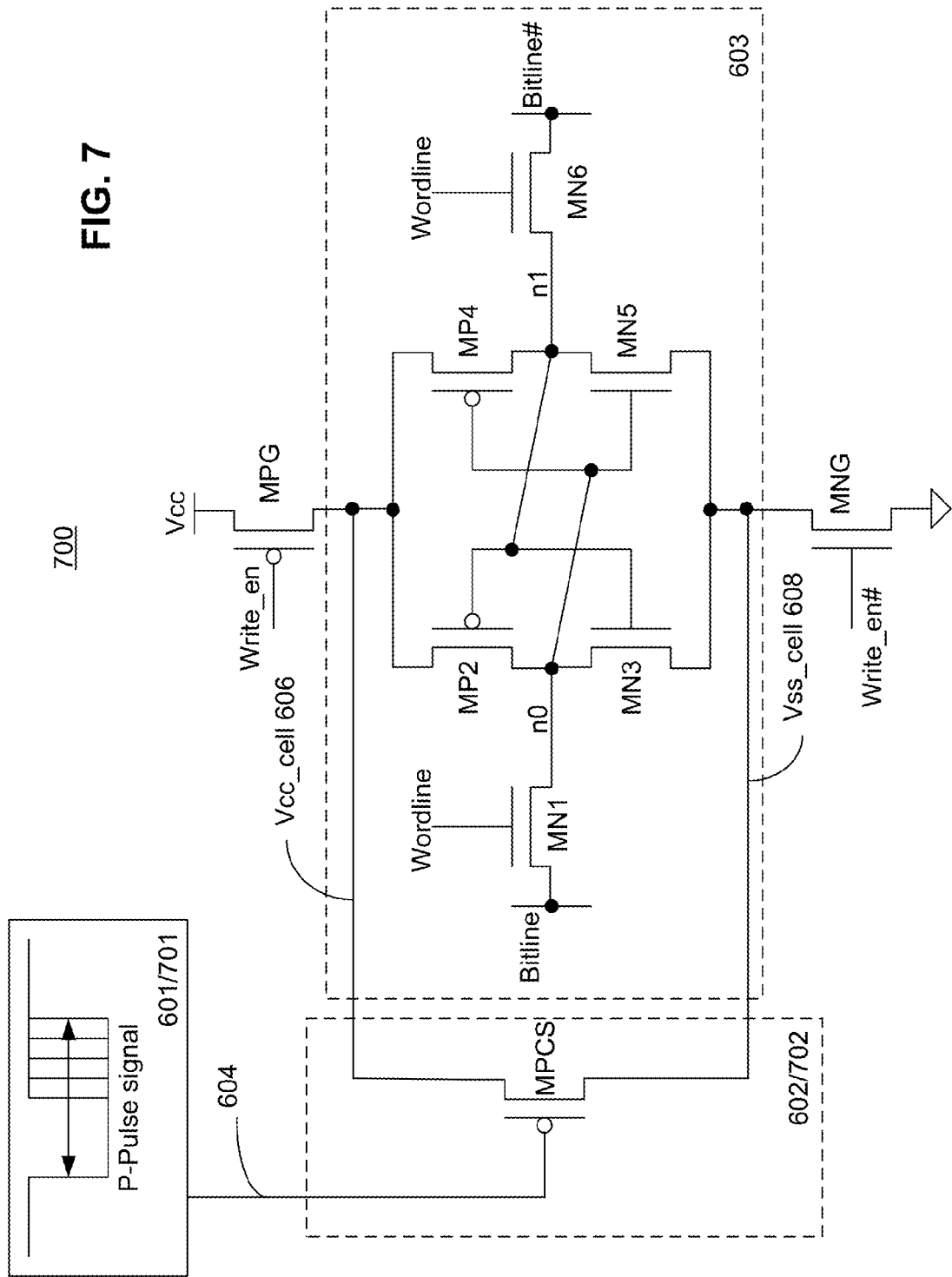
FIG. 7 is circuit implementation of the charge sharing circuit for adjusting voltage levels at the supply nodes of the memory cell, according to one embodiment of the disclosure.

FIG. 7 is circuit 700 with a charge sharing circuit 602/702 for adjusting voltage levels at the supply nodes of the memory cell 603, according to one embodiment of the disclosure. In one embodiment, the pulse generator 601/701 comprises a P-pulse signal generator to generate a high phase based pulse signal with adjustable pulse width. In one embodiment, the pulse generator 601/701 comprises any known pulse generator, wherein the pulse generator is configured to have adjustable delay resulting in adjustable phase width for the P-phase signal. In one embodiment, the pulse width of the P-phase signal 604 controls the duration of charge sharing. In one embodiment, pulse generator 601/701 generates the P-pulse signal 604 when the corresponding memory cell (or column of memory cells) is write enabled i.e., ready for write operation. In one embodiment, the pulse generator 601/701 is the same as the first circuit 101 of FIGS. 1-2.

Referring back to FIG. 7, in one embodiment the charge sharing circuit 602/702 comprises one or more p-type transistors MPCS. In one embodiment, the source terminal of MPCS is coupled to Vcc_cell 606, the drain terminal of MPCS is coupled to Vss_cell 608, and the gate terminal is coupled to the output of the pulse generator 601/701 carrying the phase signal 604. In one embodiment, the p-type transistor MPCS has variable size (W/L) to adjust the amount of charge sharing between Vcc_cell 606 and Vss_cell 608.

In one embodiment, the p-type transistor MPCS comprises a plurality of p-type transistors coupled in parallel to one another and operable to be enabled or disabled to control the amount of charge sharing between Vcc_cell 606 and Vss_cell 608. In one embodiment, other transistors (not shown) are coupled in series with the MPCS transistors, the transistors used for enabling or disabling the associated MPCS transistor from coupling of Vcc_cell 606 with Vss_cell 608. In such an embodiment, the gate terminals of the other transistors are controlled by a signal (e.g., digital bus) used for programming (enabling or disabling) MPCS transistors to control the amount of charge sharing between Vcc_cell 606 and Vss_cell 608.

In one embodiment, the speed of charge sharing is controlled by the effective size (W/L) of the coupling transistor MPCS. In one embodiment, the amount of charge sharing is controlled by the threshold voltage of MPCS.

While the embodiments herein show a p-type transistor MPCS, it can be replaced with a parallel combination of a p-type transistor with an n-type transistor, where the gate terminal of the n-type transistor is controlled by a signal which is an inverse of the P-pulse signal. In other embodiments, the p-type transistor MPCS may be replaced with other forms of controlled resistances.

In one embodiment, the memory cell 603 is a 6T SRAM cell. In one embodiment, the memory cell 603 is the same as the memory cell 103/203 of FIG. 2. So as not to obscure the embodiments of the disclosure, the structure (circuit topology) of the 6T SRAM is not repeated. Referring back to FIG. 7, in one embodiment the source terminals of MN3 and MN5 are coupled to the n-type power gate transistor(s) MNG as shown. In one embodiment, the source terminals of MP2 and MP4 are coupled to the p-type power gate transistor(s) MPG as shown.

Figure 8:
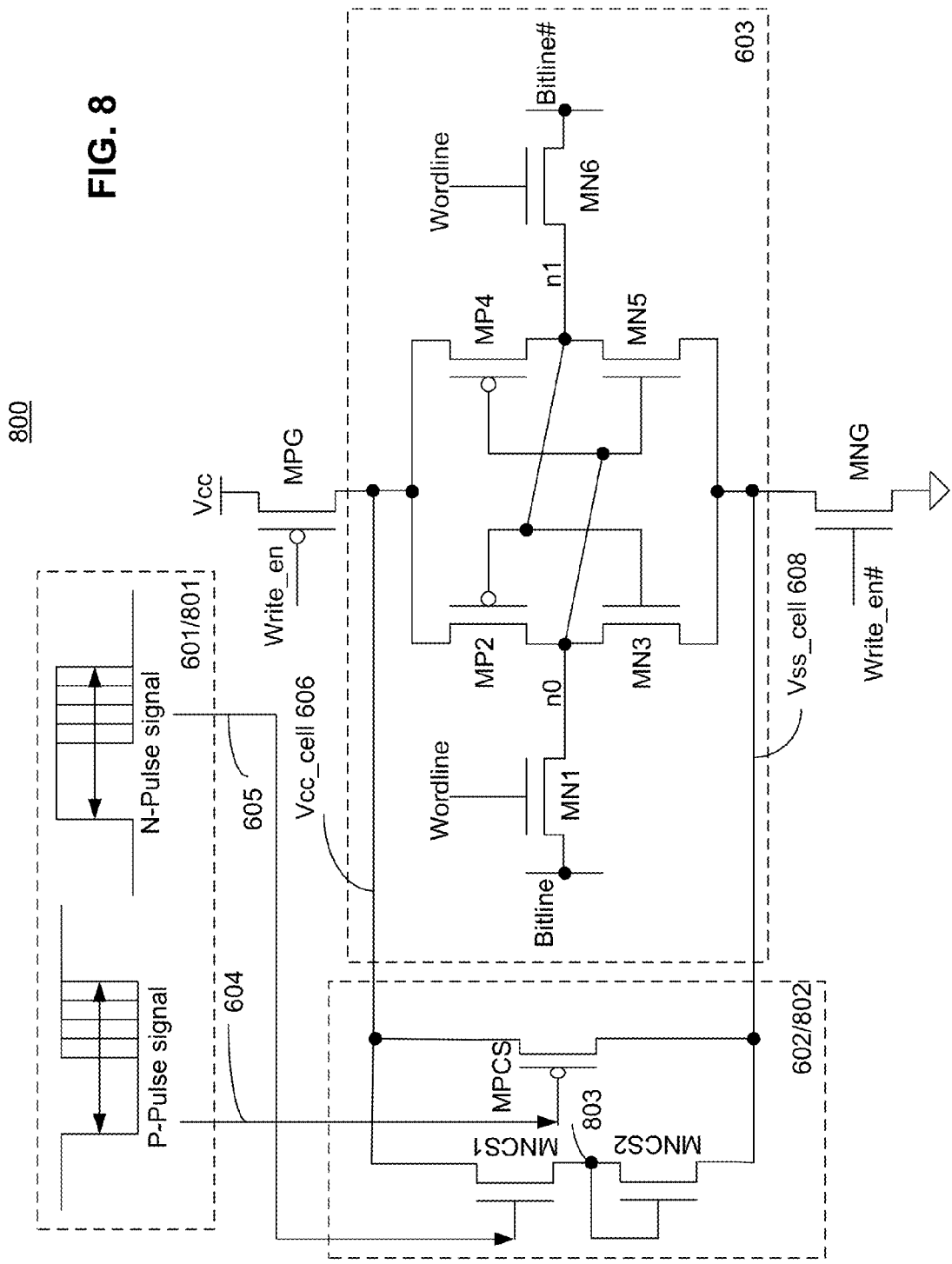
FIG. 8 is circuit implementation of the charge sharing circuit for adjusting voltage levels at the supply nodes of the memory cell, according to another embodiment of the disclosure.

FIG. 8 is circuit 800 with a charge sharing circuit 602/802 for adjusting voltage levels at the supply nodes of the memory cell 603, according to another embodiment of the disclosure. So as to avoid repetitiveness the differences between the embodiments of FIG. 8 and FIG. 7 are discussed herein. In one embodiment, the pulse generator 601/801 is operable to generate P-pulse signal 604 and N-pulse signal 605, where the N-pulse signal 605 is an inverted version of the P-pulse signal 604. For example, the N-pulse signal 605 is a high pulse width signal while P-pulse signal 604 is a low pulse width signal. In other embodiments, the pulse signals may be inverted and additional logic added to make the signals of proper polarity to function with the charge sharing circuit as disclosed.

In one embodiment, the pulse generator 601/801 is operable to generate a high phase based N-pulse signal 605 with adjustable pulse width. In one embodiment, the pulse generator 601/801 comprises any known pulse generator, wherein the pulse generator is configured to have adjustable delay resulting in adjustable phase width for the P-phase signal 604 and N-phase signal 605. In one embodiment, the pulse width of the P-phase signal 604 and N-phase signal 605 controls the duration of charge sharing. In one embodiment, pulse generator 601/801 generates the P-pulse signal 604 and the N-pulse signal 605 when the corresponding memory cell (or column of memory cells) is write enabled i.e., ready for write operation.

In one embodiment, the charge sharing circuit 602/802 comprises an n-type transistor MNCS1 coupled in series with a diode-connected n-type transistor MNCS2, where the series coupled n-type transistors (MNCS1 and MNCS2) are coupled to Vcc_cell 606 and Vss_cell 608 as shown. In one embodiment, the source terminal of the diode connected transistor MNCS2 is coupled to Vss_cell 608 while the drain terminal (and gate terminal) of the diode connected transistor MNCS2 is coupled to the source terminal of MNCS1. In one embodiment, the drain terminal of MNCS1 is coupled to Vcc_cell 606.

In one embodiment, the sizes (W/L) of MNCS1 and MNCS2 are adjustable. For example, the charge sharing circuit 602/802 may have a plurality of series coupled MNCS2 and MNCS1 with additional series transistor for enabling or disabling the branch of series coupled MNCS2 and MNCS1. In one embodiment, the additional series transistor is controlled by a digital signal for enabling or disabling the branch of series coupled MNCS2 and MNCS1.

In the embodiments discussed herein, transistors MPCS and the series coupled transistors MNCS1 and MNCS2 of the charge sharing circuit 602/802 may be used separately or simultaneously to achieve the speed requirements and voltage droop level on Vcc_cell 606.

In one embodiment, during write operation when the P-pulse signal 604 and N-pulse signal 605 are generated by the pulse generator 601/801, the P-pulse signal 604 turns on MPCS while the N-pulse signal 605 turns on MNCS1 to pass on the charge initially stored on Vcc_cell 606 to Vss_cell 608. In such an embodiment, voltage droop and voltage bump are generated on Vcc_cell 606 and Vss_cell 608, respectively, which improve write margin.

Figure 9:
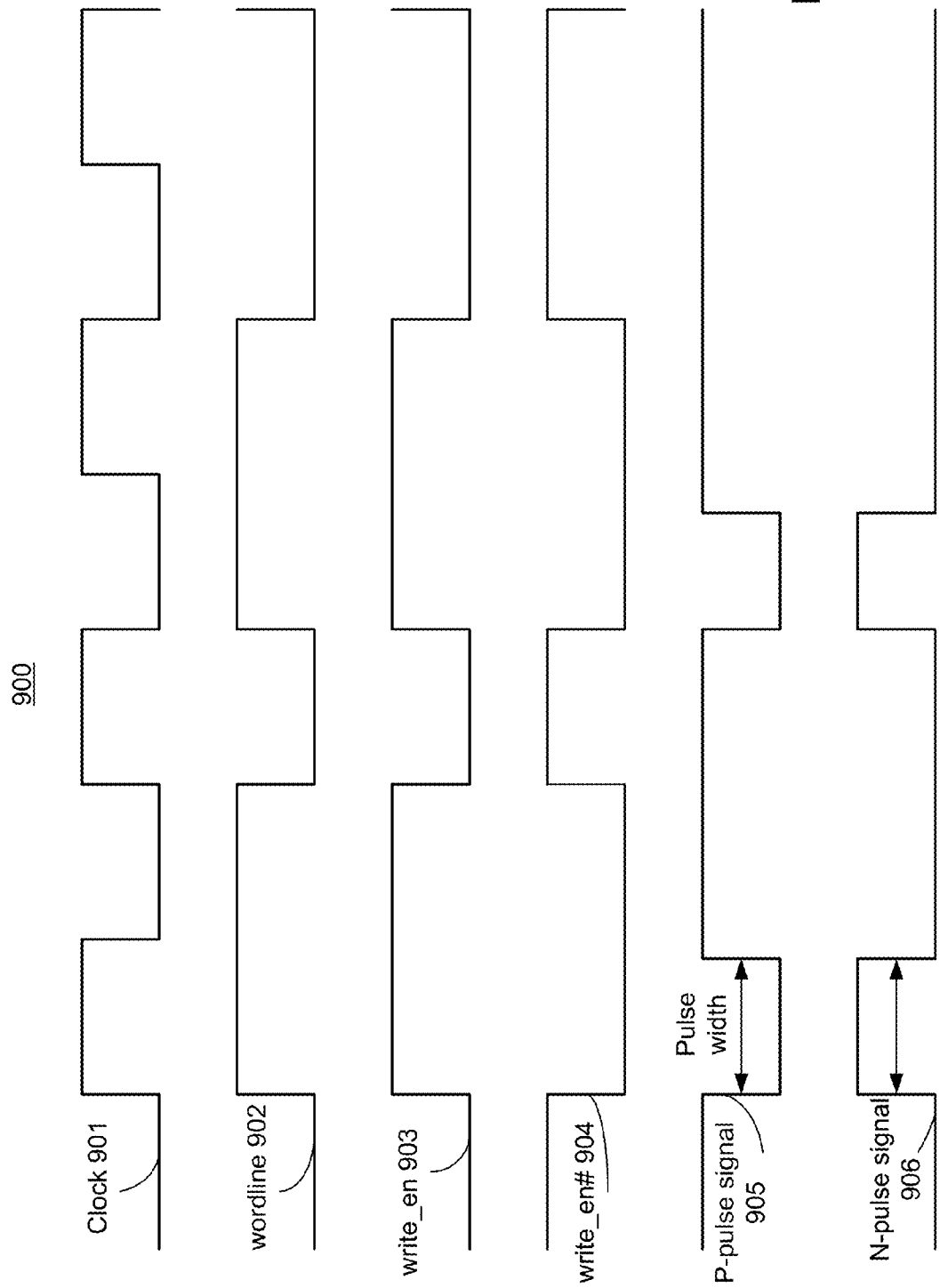
FIG. 9 is a timing diagram of signals, according to another embodiment of the disclosure.

FIG. 9 is a timing diagram 900 of signals, according to another embodiment of the disclosure. The first signal from the top is the clock signal 901, followed by wordline signal 902, write enable (write_en) signal 903, write enable bar signal (write_en#) signal 904, P-pulse signal 905, and N-pulse signal 906.

During the write operation, write_en 903 is asserted and write_en#904 is de-asserted to switch off the power gate transistors MPG and MNG respectively. As discussed herein, the P-pulse signal 905 (same as 604) and the N-pulse signal 906 (same as 605) have programmable durations (pulse widths) to control the voltage droop level on Vcc_cell 606 and voltage bump level on Vss_cell 608. The simultaneous (or substantially simultaneous) voltage droop on Vcc_cell 606 and voltage bump on Vss_cell 608 improve write margin while avoiding any DC power consumption.

Figure 10:
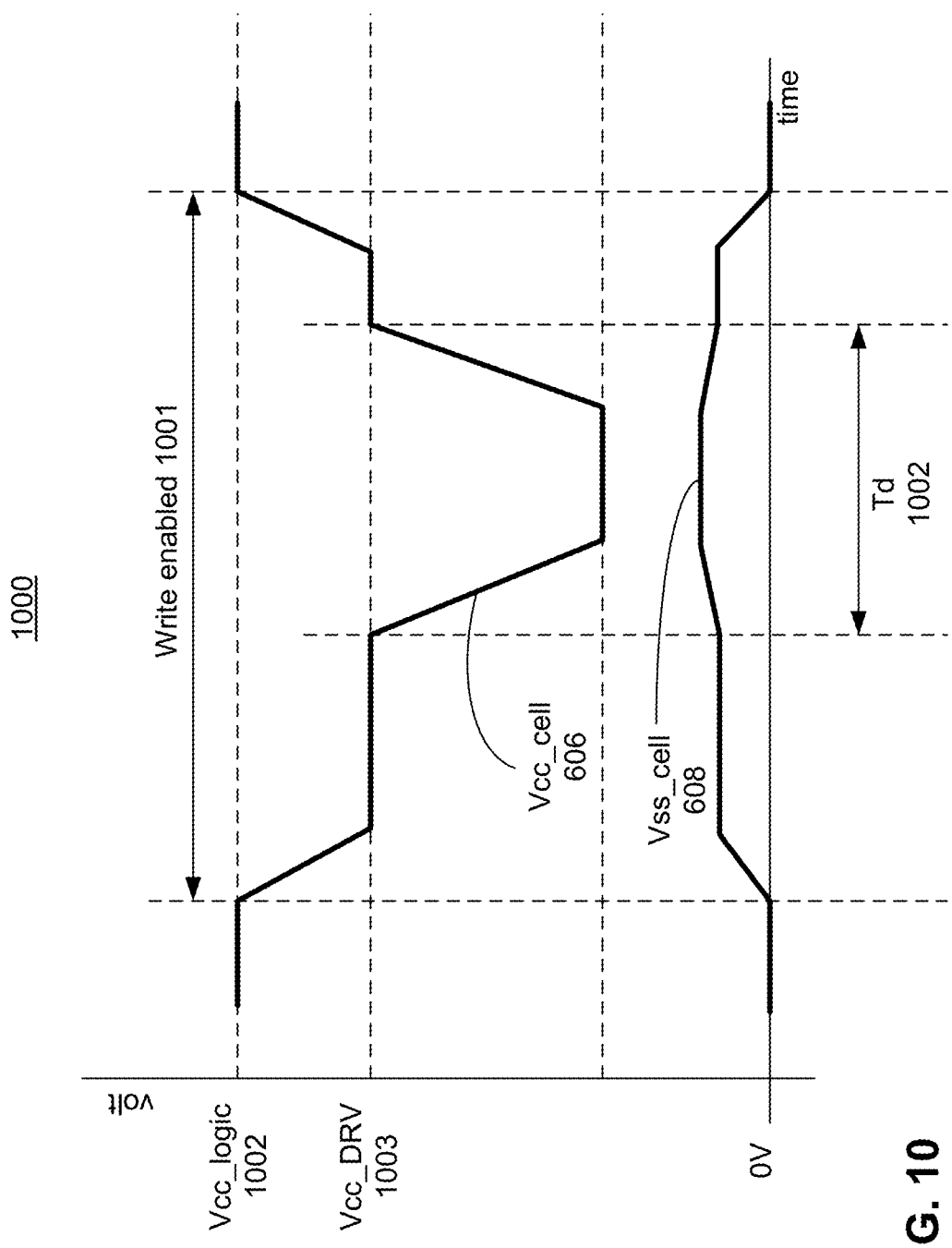
FIG. 10 is plot illustrating the operation of the charge sharing circuit in which the power supply is dynamically collapsed during write operation, according to one embodiment of the disclosure.

FIG. 10 is plot 1000 illustrating the operation of the charge sharing circuit 602 in which the high and low power supplies are dynamically changed during write operation, according to one embodiment of the disclosure. Plot 1000 is similar to plot 300 of FIG. 3. In plot 1000, Vcc_cell 606 is reduced during write operation 1001 to be below Vcc_logic 1002 and Vcc_DRV 1003 but above ground, for a duration Td 1002 corresponding to the pulse widths P-pulse signal 604 and/or N-pulse signal 605. Vcc_logic 1002 corresponds to Vcc of FIG. 6. In plot 1000, Vss_cell 608 is increased during write operation 1001 and is below Vcc_cell 606.

Figure 11:
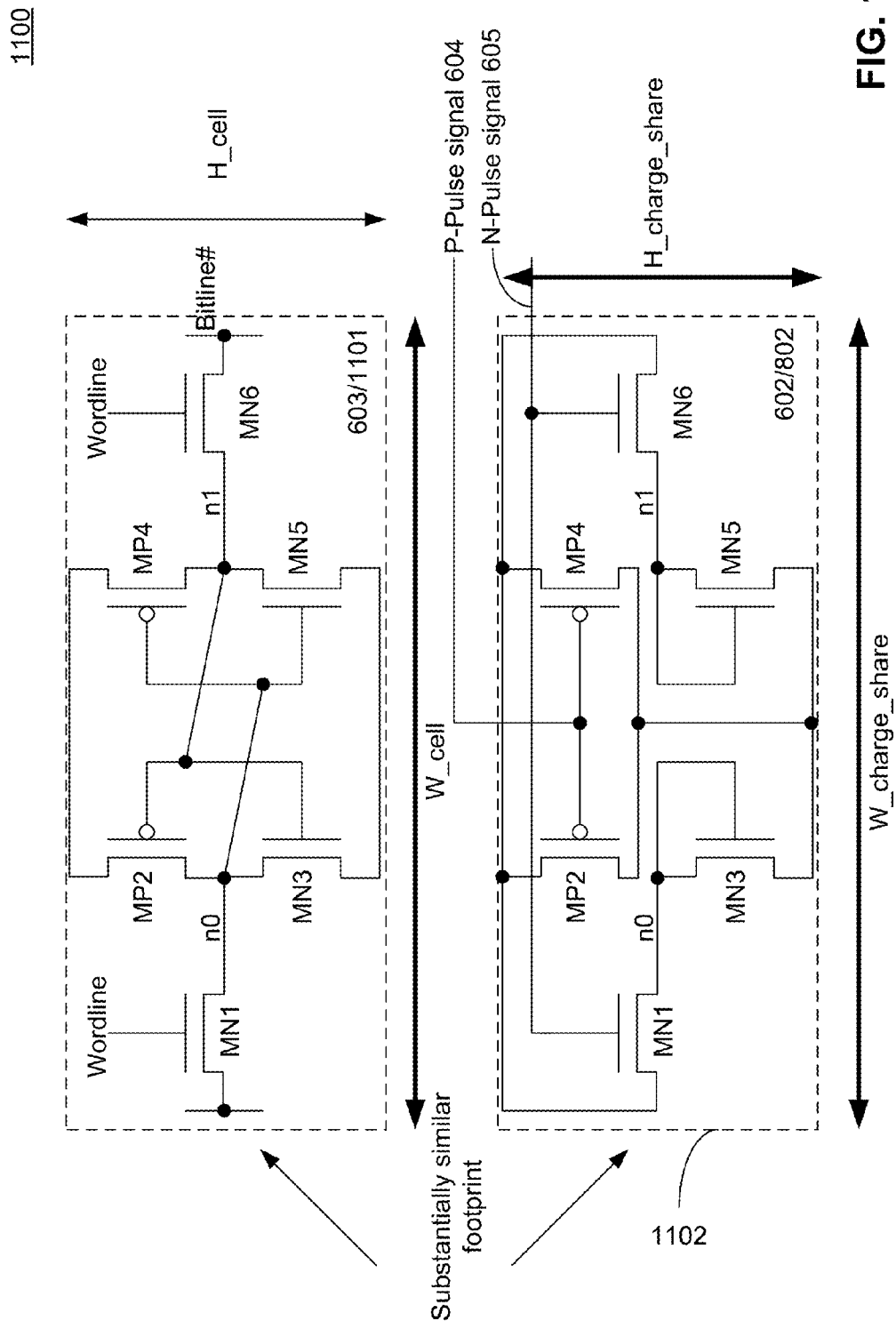
FIG. 11 is a charge sharing circuit with a footprint substantially equal to the footprint of a memory cell, according to one embodiment of the disclosure.

FIG. 11 is a comparison 1100 of a charge sharing circuit 1102 (same as 602/802) with a footprint substantially equal to the footprint of the memory cell 1101 (same as 603), according to one embodiment of the disclosure. In this embodiment, the charge sharing circuit 1102 is designed to have a footprint to match (i.e., be substantially similar or identical) according to the footprint a 6T SRAM memory cell 603. For example, width W_cell of 1101 is substantially equal to the width W_charge_share of 1102, and height H_cell of 1101 is substantially equal to the height H_charge_share of 1102.

In one embodiment, the PMOS transistors MP2 and MP4 of the charge sharing circuit 1102 realize the function of transistor MPCS of 602/802 in FIG. 8. Referring back to FIG. 11, in one embodiment NMOS transistors MN1, MN3, MN5 and MN6 of 1102 realize the function of stacked transistors MNCS1 and MNCS2 in FIG. 8. By building the charge sharing circuit 1102 using the transistors of the 6T memory cell 603/1101, the charge sharing circuit 1102 has the same footprint as the 6T SRAM bit cell 1101.

Figure 12:
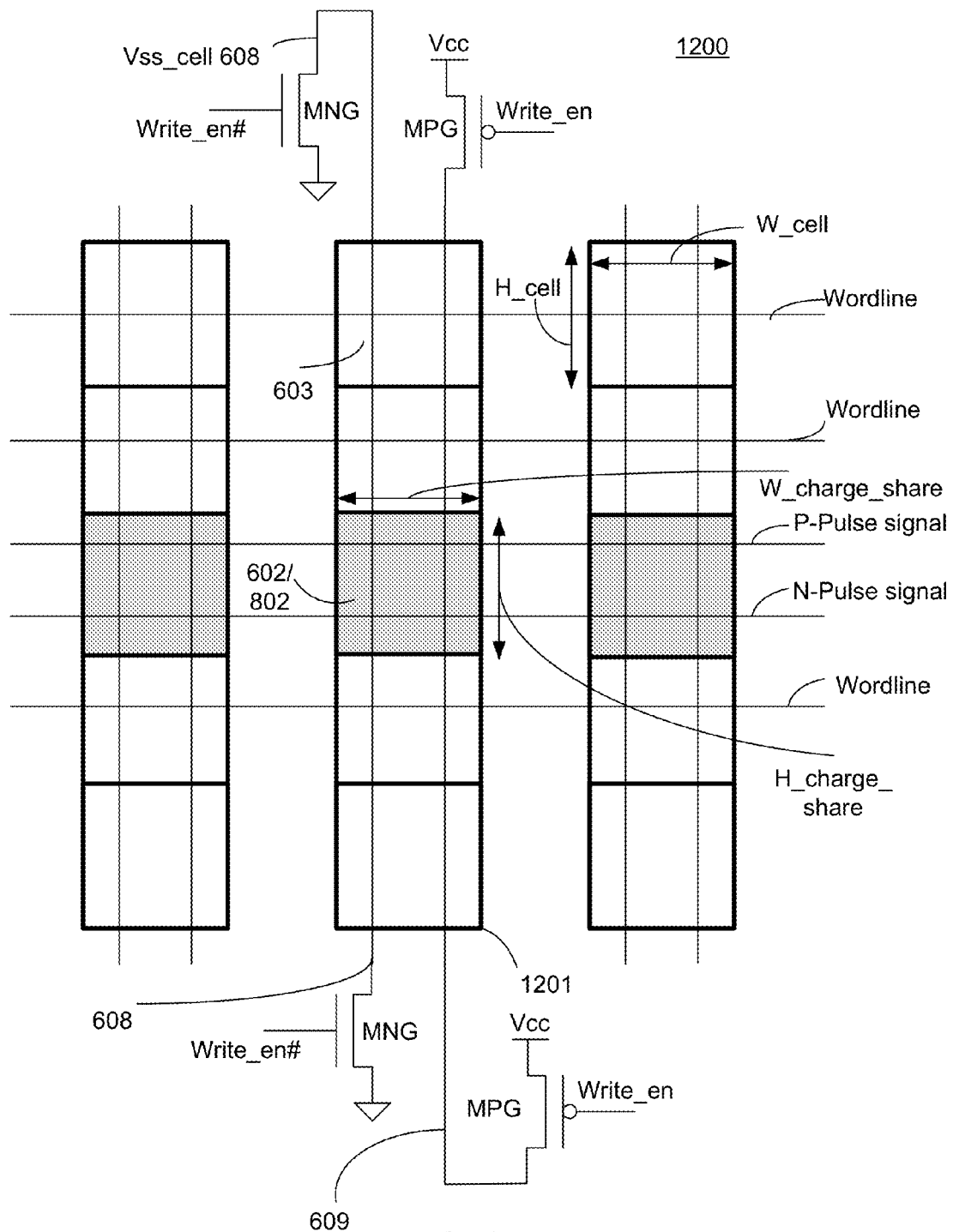
FIG. 12 are columns of memory cells with the charge sharing circuits positioned in the columns of memory cells, according to one embodiment of the disclosure.

FIG. 12 is an array 1200 with columns of memory cells with the charge sharing circuits positioned in the columns of memory cells, according to one embodiment of the disclosure. As discussed with reference to FIG. 11, the footprint of 602/802 is substantially similar to the footprint of the memory bit cell 603. In such an embodiment, the charge sharing circuit 602/1102 can be integrated into an SRAM array with minimum area overhead. By having the footprint of 602/802 to be substantially similar to the footprint of the memory bit cell 603, systematic and random process variations between the charge sharing circuit 602 and the memory cell 603 is also reduced. So as not to obscure the embodiments of the disclosure, column 1201 of the memory array 1200 is discussed.

In one embodiment, the charge sharing circuit 602 can be paired to a group of SRAM bit cells 603 in the same column 1200. The ratio between the number of charge sharing cells (circuits) 602 and bit cells 603 can be determined by the performance and area requirements. In one embodiment, adding more charge sharing cells 602 to an array can provide faster Vcc_cell 606 droop for high-speed operation at the expense of increased array area.

Figure 13:
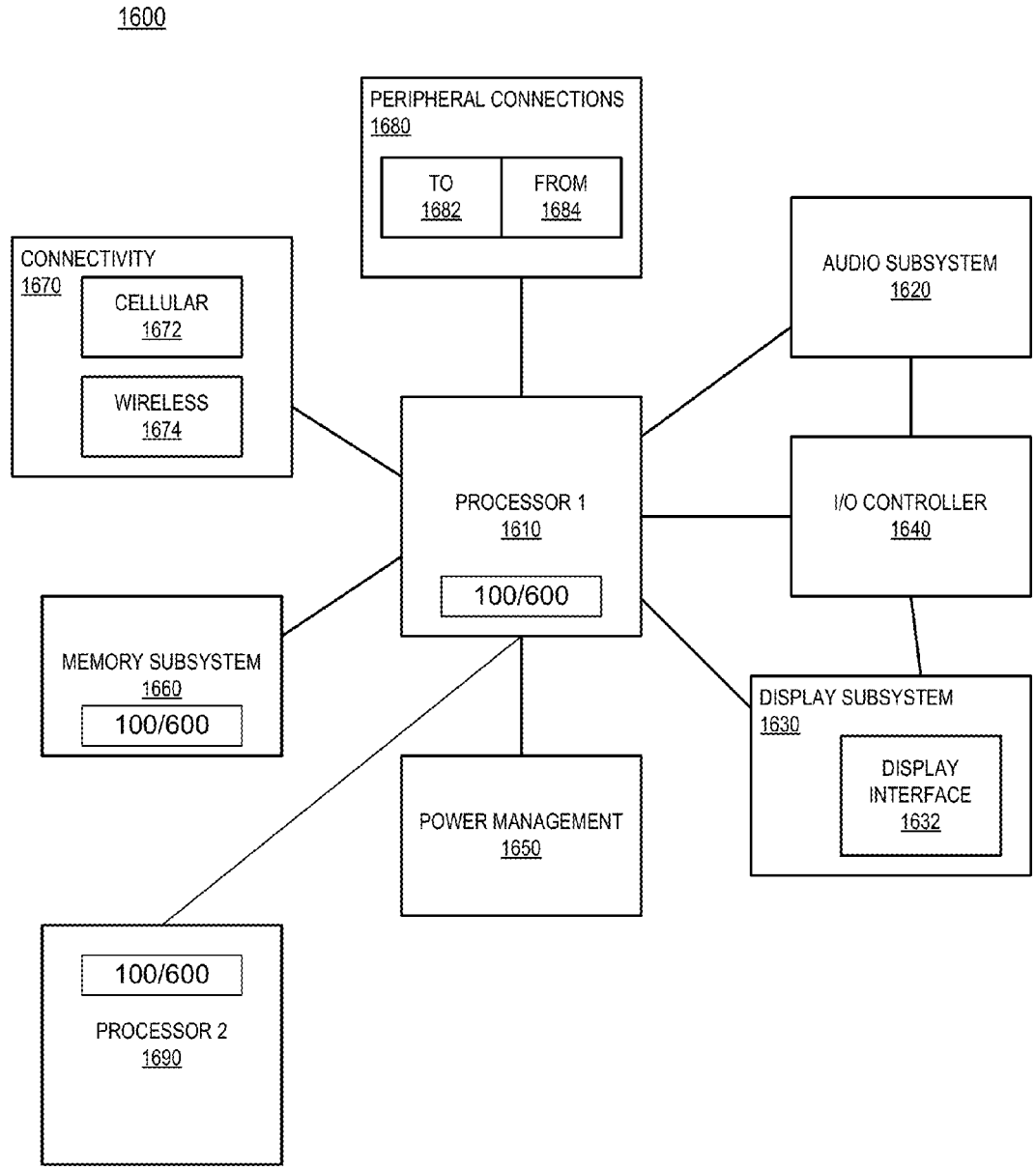
FIG. 13 is a system-level diagram of a smart device comprising a processor with memory cell having the charge sharing circuit and/or the circuit for dynamically collapsing the supply voltage, according to one embodiment of the disclosure.

FIG. 13 is a system-level diagram of a smart device comprising a processor with memory cell having the charge sharing circuit and/or the circuit for dynamically collapsing the supply voltage, according to one embodiment of the disclosure. FIG. 13 also illustrates a block diagram of an embodiment of a mobile device in which flat surface interface connectors could be used. In one embodiment, the computing device 1600 represents a mobile computing device, such as a computing tablet, a mobile phone or smart-phone, a wireless-enabled e-reader, or other wireless mobile device. It will be understood that certain of the components are shown generally, and not all components of such a device are shown in device 1600.

In one embodiment, the computing device 1600 includes a first processor 1610 with the circuit 100 and/or 600 and a second processor 1690 with the circuit 100 and/or 600, according to the embodiments discussed herein.

The various embodiments of the present disclosure may also comprise a network interface within 1670 such as a wireless interface so that a system embodiment may be incorporated into a wireless device, for example, cell phone or personal digital assistant.

In one embodiment, the processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, the computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, the I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, the computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

The self-biased oscillator 100 discussed herein can be used for wireless circuits. In one embodiment, circuit 100 and/or 600 is used in blocks 1670, 1680, 1620, 1640, and 1630 to improve write margin for memory cells.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment the apparatus comprises: a charge sharing circuit, coupled to supply nodes of a memory cell, the charge sharing circuit operable to reduce direct-current (DC) power consumption; and a pulse generator to generate a pulse signal for enabling or disabling the charge sharing circuit. In one embodiment, the supply nodes include a high supply node and a low supply node. In one embodiment, a first power gate to provide high supply to the high supply node; and a second power gate to provide low supply to the low supply node, the low supply being lower than the high supply.

In one embodiment, the first and second power gates are operable to be enabled during read operation or idle state. In one embodiment, the first and second power gates are operable to be disabled during write operation. In one embodiment, the charge sharing circuit is operable to simultaneously reduce power supply to the high supply node and to bump up a voltage supply to the low supply node, wherein the voltage supply is bumped up above ground.

In one embodiment, the memory cell is an SRAM cell. In one embodiment, the charge sharing circuit comprises: a p-type transistor with a gate terminal for receiving the pulse signal, wherein the drain and source terminals of the p-type transistor are coupled to the supply nodes of the memory cell. In one embodiment, the charge sharing circuit comprises: a first n-type transistor operable to receive another pulse signal; and a second n-type transistor coupled in series with the first n-type transistor, wherein the first and second n-type transistors have terminals coupled to the supply nodes of the memory cell.

In one embodiment, the second n-type transistor is a diode-connected transistor. In one embodiment, the pulse generator is operable to generate the other pulse signal. In one embodiment, the pulse generator is operable to adjust pulse widths of the pulse signal and the other pulse signal. In one embodiment, the pulse generator is operable to generate pulse width of the pulse signal which is complementary to pulse width of the other pulse signal.

In one embodiment, the pulse generator is operable to generate a pulse width of the pulse signal to be different in duration from pulse width of the other signal. In one embodiment, the pulse generator is operable to generate a pulse width of the pulse signal to be same in duration from pulse width of the other signal. In one embodiment, the charge sharing circuit is enabled to share charge of the supply nodes of the memory cell during write operation. In one embodiment, the charge sharing circuit is disabled from sharing charge of the supply nodes of the memory cell during read operation.

In one embodiment, the charge sharing circuit is operable to reduce a level of power supply to the supply node of the memory cell to be below a data retention voltage level of the memory cell, wherein the charge sharing circuit is operable to reduce a level of power supply for a time period corresponding to a width of the pulse signal. In one embodiment, the charge sharing circuit is operable to reduce a power supply level to the supply node of the memory cell to be between ground and a data retention voltage. In one embodiment, the memory cell is a 6T SRAM cell. In one embodiment, the charge sharing circuit has a layout footprint substantially equal to a layout footprint of the 6T SRAM cell. In one embodiment, the charge sharing circuit to provide charge sharing to multiple memory cells in a row or column of memory cells.

In another example, the apparatus comprises: a column of memory cells having a high supply node and a low supply node; and a charge sharing circuit positioned in the column of memory cells, the charge sharing circuit coupled to the high and low supply nodes, the charge sharing circuit operable to reduce direct-current (DC) power consumption. In one embodiment, the apparatus comprises a pulse generator to generate a pulse signal for enabling or disabling the charge sharing circuit.

In one embodiment, the charge sharing circuit is operable to reduce a power supply level to the high supply node to be between ground and a transistor threshold voltage. In one embodiment, the memory cell of the column of memory cells is a 6T SRAM cell. In one embodiment, the charge sharing circuit is operable to adjust speed of write operation by adjusting a number of charge sharing circuits operable in the column of memory cells. In one embodiment, the apparatus comprises another charge sharing circuit, positioned in the column of memory cell, to adjust speed of write operation. In one embodiment, the charge sharing circuit has a layout footprint substantially equal to a layout footprint of the 6T SRAM cell.

In one embodiment, the charge sharing circuit comprises: a p-type transistor with a gate terminal for receiving a pulse signal, wherein the drain and source terminals of the p-type transistor are coupled to the high and low supply nodes. In one embodiment, the charge sharing circuit comprises: a first n-type transistor operable to receive another pulse signal; and a second n-type transistor coupled in series with the first n-type transistor, wherein the first and second n-type transistors have terminals coupled to the high and low supply nodes. In one embodiment, the second n-type transistor is a diode-connected transistor.

In another example, the system comprises a wireless antenna; and a processor capable of communicating with another device via the wireless antenna, the processor including an array of memory cells and comprising the apparatus discussed herein.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus for improving write margin of a memory cell, the apparatus comprising:
a first circuit to provide a pulse signal with a width; and
a second circuit to receive the pulse signal and to generate a power supply for the memory cell, wherein the second circuit to reduce a level of the power supply below a data retention voltage level of the memory cell for a time period corresponding to the width of the pulse signal, wherein the second circuit is operable to reduce the level of the power supply to the memory cell during write operation of the memory cell.

2. The apparatus of claim 1, wherein the second circuit comprises an inverter which is operable to receive the pulse signal as an input, wherein the inverter has an output to provide the power supply for the memory cell.

3. The apparatus of claim 1, wherein the second circuit is operable to provide the power supply to the memory cell during read operation or idle state of the memory cell.

4. The apparatus of claim 1, wherein the first circuit is operable to adjust the width of the pulse signal.

5. The apparatus of claim 4, wherein the first circuit is operable to adjust the width of the pulse signal by at least one of:
a fuse; or
software instruction.

6. The apparatus of claim 1, wherein the first circuit comprises a pulse generator with a variable delay to provide an adjustable pulse width.

7. The apparatus of claim 1, wherein the memory cell is a 6T SRAM cell.

8. The apparatus of claim 1, wherein the second circuit is operable to reduce the power supply level to be between ground and the data retention voltage.

9. The apparatus of claim 1, wherein the second circuit is operable to reduce the power supply level to ground.

10. The apparatus of claim 1, wherein the second circuit is operable to provide normal power supply to the memory cell after the pulse width ends.

11. A system comprising:

a wireless antenna; and a processor capable of communicating with another device via the wireless antenna, the processor including an array of memory cells and comprising:

a first circuit to provide a pulse signal with a width; and a second circuit to receive the pulse signal and to generate a power supply for a memory cell from the array of memory cells, wherein the second circuit to reduce a level of the power supply below a data retention voltage level of the memory cell for a time period corresponding to the width of the pulse signal, wherein the second circuit is operable to reduce the level of the power supply to the memory cell during write operation of the memory cell.

12. The system of claim 11, wherein the second circuit comprises an inverter which is operable to receive the pulse signal as an input, wherein the inverter has an output to provide the power supply for the memory cell.

13. The system of claim 12 further comprises a display unit for displaying content processed by the processor.

14. The system of claim 11, wherein the second circuit is operable to:

provide the power supply to the memory cell during read operation or idle state of the memory cell.

15. The system of claim 11, wherein the first circuit is operable to adjust the width of the pulse signal by at least one of:

a fuse; or software instruction.

* * * * *